United States Patent [19]
Hafle

[11] 4,362,358
[45] Dec. 7, 1982

[54] OPTICAL ENCODER HAVING ONLY ONE OR TWO FIBER OPTIC CABLES

[75] Inventor: Ralph S. Hafle, Benton, Ark.

[73] Assignee: BEI Electronics, Inc., Little Rock, Ark.

[21] Appl. No.: 177,832

[22] Filed: Aug. 13, 1980

[51] Int. Cl.³ .............................................. G02B 5/14
[52] U.S. Cl. .................................. 350/96.16; 250/227
[58] Field of Search .......................... 350/96.20, 96.16; 250/227, 237 R, 237 G; 340/347 P

[56] References Cited

U.S. PATENT DOCUMENTS

| | | | |
|---|---|---|---|
| 3,354,319 | 11/1967 | Lowen et al. | 250/227 |
| 3,999,864 | 12/1976 | Mutter | 250/227 |
| 4,096,383 | 6/1978 | Mancini et al. | 250/227 |

*Primary Examiner*—David K. Moore
*Attorney, Agent, or Firm*—Burmeister, York, Palmatier, Hamby & Jones

[57] ABSTRACT

A multidigit fiber optic encoder having only one or two fiber optic cables between an active zone containing a light source and photodetectors, and a passive zone containing a multidigit code member having a multitude of code tracks. First and second sets of color filters are associated with the code tracks and the photodetectors, so that each code track modulates light of a different color, which is transmitted to only the corresponding photodetector. The light beams of the different colors are combined for transmission between the passive and active zones. A single fiber optic cable may be employed between the active and passive zones for transmitting light in both directions, by providing first and second beam splitters at the active and passive ends of the cable to split the transmitted and received light. Alternatively, two fiber optic cables may be employed to transmit light in the opposite directions, to obviate any need for the beam splitters. The light source provides white light or light containing multiple spectral lines, for illuminating all of the code tracks.

8 Claims, 2 Drawing Figures

OPTICAL ENCODER HAVING ONLY ONE OR TWO FIBER OPTIC CABLES

This invention relates to optical encoders of the type having fiber optic cables or other similar fiber optic devices between active and passive zones. In such encoders, the light source, the photodetectors and the associated electronic equipment are contained in the active zone where the environment is controlled so as to be compatible with such gear. The optical code member is in the passive zone where the environment may be hostile. The illuminating light and the modulated light are transmitted to and from the code member by the fiber optic cables.

One object of the present invention is to provide a new and improved multidigit optical encoder in which only one or two fiber optic cables are employed between the active and passive zones, to transmit an illuminating beam and a multitude of modulated beams to and from the code member, which may have a multitude of code tracks.

A further object is to provide such a new and improved optical encoder in which a single fiber optic cable is employed, to transmit light in both directions to and from the multiple code tracks of the code member.

An alternate object of the present invention is to provide a new and improved optical encoder having two fiber optic cables for transmitting light in opposite directions, to and from the multiple code tracks of the code member.

In accordance with the present invention, these objects are accomplished by providing an optical encoder comprising a multicolored light source and multiple photodetectors in an active zone and an optical encoding member in a passive zone, such encoding member having multiple code tracks, first fiber optic means for conducting light from the light source to the multiple code tracks, such first fiber optic means having branches in the passive zone to supply the illumination to the respective code tracks, second fiber optic means for combining the modulated light beams from the code tracks and conducting the combined beams to the active zone, such second fiber optic means having photodetector branches in the active zone for conducting portions of the combined light beams to the photodetectors, a first set of color filters associated with the respective code tracks in the passive zone for imparting a different color to the light beam which is modulated by each code track, and a second set of color filters associated with the photoconductors for transmitting light of each different color to one particular photodetector, whereby each photodetector receives light which has been modulated by the corresponding code track.

In one embodiment, the first and second fiber optic means comprise only one fiber optic cable for transmitting both the illumination and the modulated light beams in both directions between the active and passive zones. First and second beam splitters are employed in the active and passive zones for splitting the transmitted and received light beams.

In the second embodiment, the first and second fiber optic means comprise two distinct fiber optic cables for transmitting the illumination and the modulated light beams in opposite directions between the active and passive zones. The second embodiment does not require the beam splitters.

Further objects, advantages and features of the present invention will appear from the following description, taken with the accompanying drawings, in which.

Figure 1:
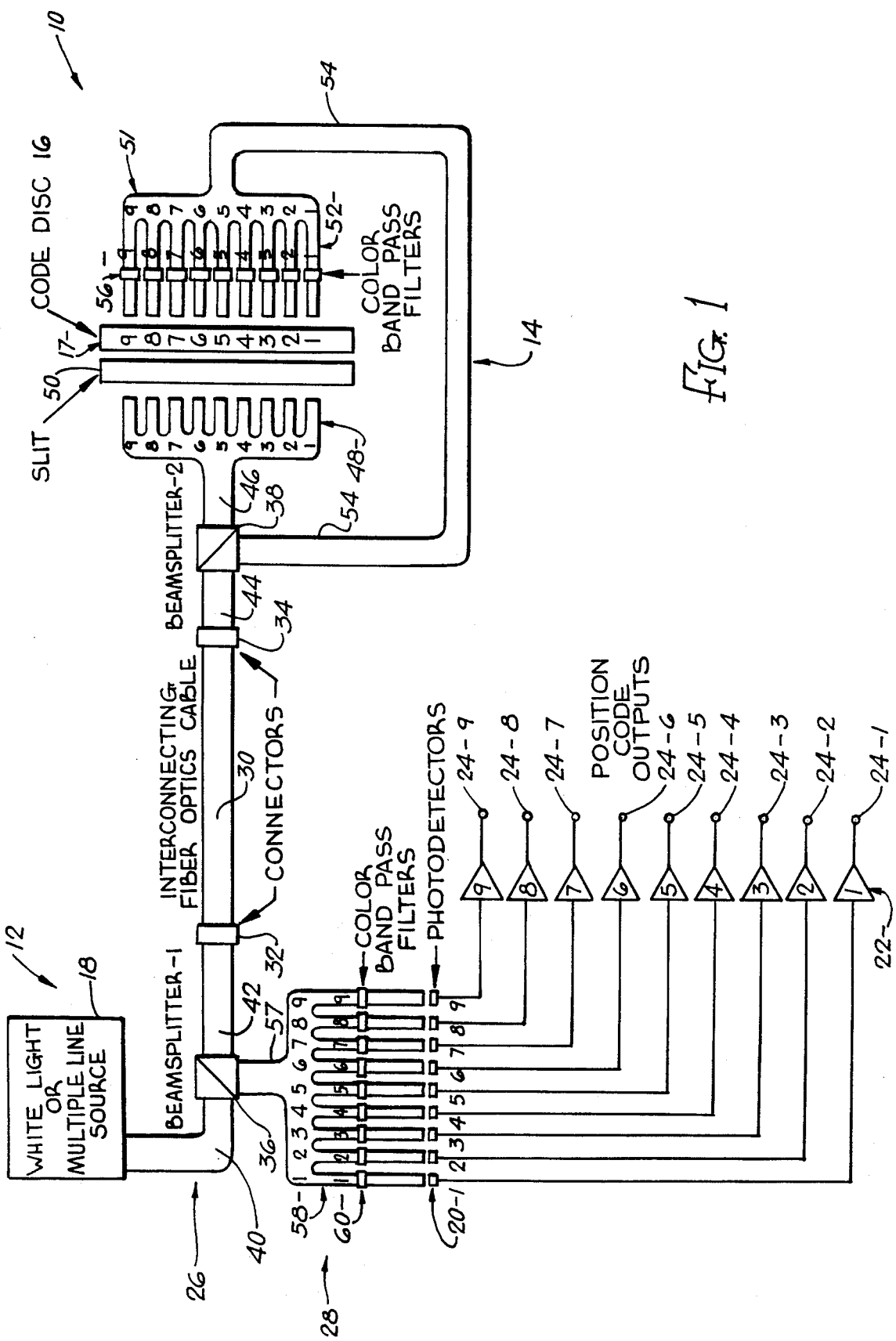
FIG. 1 is a schematic diagrammatic representation of an optical encoder having only one fiber optic cable between the active and passive zones.

As just indicated, FIG. 1 illustrates an optical encoder 10 which is in the form of a system or apparatus having some components in an active zone 12 and other components in a passive zone 14. The environment in the passive zone 14 may be hostile to the operation of electronic and electrical components. For example, the passive zone 14 may be exposed to the exterior of a spacecraft or aircraft. On the other hand, the environment in the active zone 12 may be controlled so as to foster the reliable operation of electronic and electrical components. For example, the active zone 12 may be in a controlled environment within a spacecraft or airplane.

The basic purpose of the optical encoder 10 is to provide a set of electrical signals, accurately indicating the position or movement of a code member 16, which is indicated as a rotatable code disc, but may be in various other forms, such as a linearly movable code member. The code member 16 may be of any known or suitable construction. Some examples of such code members are disclosed in U.S. Pat. Nos. 3,710,375, 3,618,074 and 3,040,322. Many other examples could be cited.

The code member 16 may have any suitable number of code tracks, such as the illustrated nine tracks identified by the numerals 17-1 through 17-9. Each code track is adapted to modulate or interrupt a separate light beam. Thus, each track may comprise alternate elements which transmit or interrupt the light beam. For example, the elements may be alternately transparent and opaque.

It will be seen that the code disc or member 16 is positioned in the passive zone 14. The rotatable code disc 16 may be connected to a rotatable component, the position of which is to be accurately indicated. For example, the code disc 16 may be connected to a directional radio antenna having a rotatable mount.

The active zone 12 includes a light source 18 for illuminating the code member 16 and a set of photodetectors 20 for producing electrical signals corresponding to the modulation of the light beams by the code tracks 17-1 through 17-9. The photodetectors correspond in number to the code tracks. Thus, the individual photodetectors are identified by the numbers 1 through 9 and will be identified as 20-1 through 20-9.

The photodetectors 20 produce electrical signals which are amplified by amplifiers 22. The individual amplifiers are marked with the numerals 1–9 and will be identified as 22-1 through 22-9. The output signals from the amplifiers 22 are supplied to a set of output terminals 24-1 through 24-9. Generally, each output signal represents a different binary digit of a multidigit binary number, indicating the position of the code ember 16.

The light source 18 and the photoconductors 20 are connected to the code member 16 by fiber optic means extending between the active zone 12 and the passive zone 14. The fiber optic system may be regarded as including first fiber optic means 26 for transmitting light from the light source 18 to the code member 16, and second fiber optic means 28 for transmitting the modulated light beams from the code member 16 to the photodetectors 20. In the embodiment of FIG. 1, the first and second fiber optic means 26 and 28 share a single fiber optic cable 30, extending between the active and passive zones 12 and 14. As shown, the fiber optic cable 30 has connectors 32 and 34 at its opposite ends for connecting the cable 30 to other fiber optic components in the active and passive zones 12 and 14.

In order that the fiber optic cable 30 may transmit light in both directions, the active and passive zones 12 and 14 are provided with first and second beam splitters 36 and 38 for splitting the transmitted and received beams. Such beam splitters 36 and 38 may be of any known or suitable construction. For example, the beam splitters may employ half-silvered mirrors or other similar elements which both transmit and reflect light. As shown, light is transmitted through the first beam splitter 36 between fiber optic elements 40 and 42. The fiber optic element 40 is connected between the light source 18 and the beam splitter 36. The fiber optic element 42 extends between the beam splitter 36 and the connector 32, whereby the fiber optic element 42 is connected to the adjacent end of the fiber optic cable 30.

The second beam splitter 38 is operative to transmit light between fiber optic elements 44 and 46. The fiber optic element 44 extends between the connector 34 and the second beam splitter 38, while the fiber optic element 46 is operative to supply illuminating beams to the code tracks 17-1 through 17-9. As shown, the fiber optic element 46 has a branched portion 48 with nine branches 48-1 through 48-9 for distributing the illumination to the nine code tracks 17-1 through 17-9.

As shown, a slit or aperture device 50 is associated with the code member 16 to provide a slit or aperture element through which each individual light beam is transmitted to or from each of the code tracks 17-1 through 17-9.

As previously indicated, each of the code tracks 17-1 through 17-9 modulates or interrupts its individual light beam when the code member 16 is moved. The modulated light beams are received and combined by a fiber optic device or member 51 having branches 52-1 through 52-9, extending from the corresponding code tracks 17-1 through 17-9. The nine modulated beams are combined and transmitted into a fiber optic cable 54 which extends back to the second beam splitter 38. The modulated light beams are reflected by the second beam splitter 38 between the fiber optic cable 54 and the fiber optic element 44 which leads to the interconnecting fiber optic cable 30.

In accordance with the present invention, a different color or wavelength is imparted to each of the modulated beams from the code tracks 17-1 through 17-9. This is preferably accomplished by providing a set of color filters 56, associated with the corresponding code tracks 16-1 through 16-9. The individual color filters will be identified as 56-1 through 56-9. Each of the color filters 56 may be inserted anywhere along the path of the corresponding light beam which is modulated by the corresponding code track. As shown, the color filters 56-1 through 56-9 are inserted into the fiber optic branches 52-1 through 52-9. However, it will be understood that the color filters 56 may be inserted into the branches 48-1 through 48-9 which distribute the illumination to the code tracks. The color filters 56 may also be positioned on either side of the code member 16, between the code member and either of the branched fiber optic members 48 and 52.

The color filters 56 are preferably of the bandpass type, adapted to transmit a band of wavelengths. Each of the filters 56-1 through 56-9 transmits a different band of wavelengths, corresponding to a different color.

The color filters 56-1 through 56-9 may be of the thin film type, utilizing constructive and destructive interference effects to produce the desired color filtering action. The color filters may also be of the dyed gelatine type. The modulated light beams of the nine different colors are combined by the branched fiber optic element 51 and are transmitted along the fiber optic cable 54 to the second beam splitter 38 which reflects the modulated light beams along the fiber optic member 44 and the fiber optic cable 30, back to the active zone 12. The modulated light beams are then transmitted by the fiber optic element 32 to the first beam splitter 46 which reflects the modulated light beams into a branched fiber optic member 57 having nine branches 58-1 through 58-9 which distribute portions of the modulated light beams to the respective photodetectors 20-1 through 20-9. The optical encoder includes a second set of color filters 60-1 through 60-9 which are associated with the respective photodetectors 20-1 through 20-9. The color filters 60-1 through 60-9 are preferably of the bandpass type and are of the same colors as the first set of color filters 56-1 through 56-9. Thus, each of the second color filters 60 transmits light of the same color as the corresponding filter in the first set 56. The arrangement is such that only the colored light which is transmitted by the first color filter 56-1 is transmitted by the receiving color filter to the first photodetector 20-1. Similarly, each of the other color filters 60-2 through 60-9 transmits only the light from the corresponding code track 16 to the corresponding photodetector 20. The color filters 60-1 through 60-9 are preferably of the bandpass type and may utilize thin film techniques to produce constructive and destructive interference, or may be of the dyed gelatine type. The second color filters 60-1 through 60-9 are shown as being interposed between segments of the fiber optic branches 58-1 through 58-9. However, the color filters 60-1 through 60-9 may be located elsewhere, such as between the ends of the branches 58-1 through 58-9 and the corresponding photodetectors 20-1 through 20-9.

Thus, each photodetector 20-1 through 20-9 receives modulated light from only one of the code tracks 16-1 through 16-9. Hence, the photodetectors 20-1 through 20-9 produce signals which represent the movement of the corresponding code tracks 17-1 through 17-9. Such signals are amplified by the amplifiers 22-1 through 22-9, which supply the amplified signals to the output terminals 24-1 through 24-9.

By employing the first set of bandpass color filters 56 it is possible to combine the nine differently colored beams, with the modulations imparted by the code tracks 17-1 through 17-9, so that the combined beams can be transmitted back to the active zone 12 by the same fiber optic cable 30 which is also employed to transmit the illumination to the code tracks 16-1 through 16-9.

Figure 2:
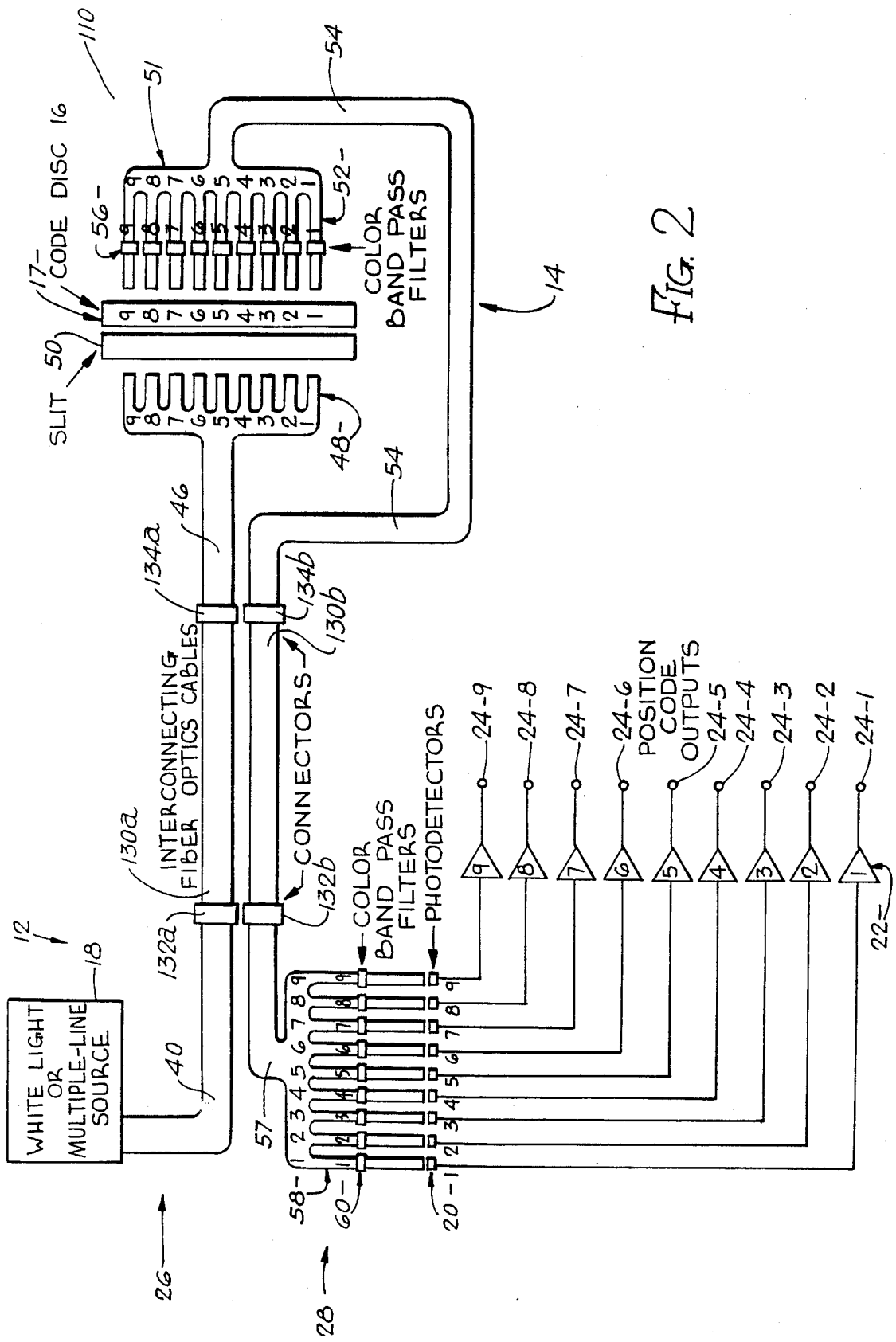
FIG. 2 is a schematic diagrammatic representation of a modified embodiment, having two fiber optic cables for transmitting light in opposite directions between the active and passive zones.

FIG. 2 illustrates a modified optical encoder 110, which is the same as the embodiment of FIG. 1, except that two fiber optic cables 130a and 130b are employed, instead of the single fiber optic cable 30 of FIG. 1. The first fiber optic cable 130a is connected between the fiber optic elements 40 and 46 in the active and passive zones 12 and 14 and is operative to transmit illumination from the light source 18 to the code tracks 17-1 through 17-9. Connectors 132a and 134a are provided at the ends of the fiber optic cable 131a.

The second fiber optic cable 130b is connected between the fiber optic element 54 in the passive zone 14 and the branched fiber optic member 57 in the active zone 12. Connectors 132b and 134b are provided at the ends of the second fiber optic cable 130b. It will be evident that the modulated light beams of the different colors from the code tracks 17-1 through 17-9 are transmitted back to the active zone 12 by the second fiber optic cable 130b.

While the optical encoder 110 of FIG. 2 has two fiber optic cables 130a and 130b between the active and passive zones 12 and 14, there is no need for the beam splitters in this embodiment. The cost of the beam splitters is eliminated. Moreover, the light is transmitted with greater efficiency in both directions. It will be evident that the optical encoder 110 of FIG. 2, with the two distinct fiber optic cables 130a and 130b, will be advantageous in some cases. When it is impossible or undesirable to provide more than one interconnecting fiber optic cable, the optical encoder 10 of FIG. 1 is advantageous.

In both of the embodiments of FIGS. 1 and 2, the light source 18 should produce light containing all of the colors corresponding to the color filters 56 and 60. Thus, the light source 18 may produce white light or light containing a multiple line spectrum. To produce white light, the light source 18 may advantageously comprise an incandescent lamp.

In the operation of the optical encoder 10 of FIG. 1, the light source 18 produces white light or light containing multiple spectral lines. The light from the source 18 is transmitted by the fiber optic element 40, the first beam splitter 36, the fiber optic element 42, the fiber optic cable 30, the fiber optic element 44, and the second beam splitter 38 to the branched fiber optic member 46, which distributes the illumination to the slit 50 and the code tracks 17-1 through 17-9 of the code member 16. The nine code tracks modulate the corresponding light beams and supply the modulated light beams to the branches 52-1 through 52-9 of the fiber optic member 51. A different color is imparted to each of the nine light beams by the bandpass color filters 56-1 through 56-9.

These colored light beams are combined by the fiber optic member 51. The combined beams are transmitted by the fiber optic element 54 to the second beam splitter 38, which reflects the combined beams along the fiber optic element 44, the fiber optic cable 30 and the fiber optic element 42 to the first beam splitter 36. The combined beams are then reflected by the beam splitter 36 into the branched fiber optic member 57, which distributes the light to the photodetectors 20-1 through 20-9. The bandpass color filters 60-1 through 60-9 have the same colors as the filters 56-1 through 56-9. Thus, the modulated light of a particular color from each of the code tracks 17-1 through 17-9 is supplied to only one of the photodetectors 20-1 through 20-9. Accordingly, the nine modulated light beams from the code tracks 17-1 through 17-9 are supplied to the corresponding photodetectors 20-1 through 20-9. Each photodetector produces an electrical signal corresponding to the modulated light beam from the corresponding code track. The nine electrical signals are amplified by the amplifiers 22-1 through 22-9, which supply their output signals to the output terminals 24-1 through 24-9.

The optical encoder 10 of FIG. 1 has the advantage that only one fiber optic cable 30 is needed between the active and passive zones 12 and 14. Nevertheless, the optical encoder is capable of producing a set of nine signals, representing the digits of a nine digit binary number, which accurately indicates the position of the code member 16.

The operation of the modified optical encoder 110 of FIG. 2 is the same as described in connection with the encoder 10 of FIG. 1, except that the modified encoder 110 has two fiber optic cables 130a and 130b between the active and passive zones 12 and 14. The illuminating light from the light source 18 is transmitted between the active and passive zones by the first fiber optic cable 130a. The modulated light beams from the code tracks 17-1 through 17-9, after passing through the color filters 56-1 through 56-9, are combined by the fiber optic member 51 and transmitted back to the active zone by the second fiber optic cable 130b. The optical encoder 110 of FIG. 2 does not require the beam splitters which are employed in the optical encoder 10 of FIG. 1.

I claim:

1. An optical encoder, comprising
a multi-colored light source in an active zone,
first fiber optic means for conducting light from said source to a passive zone,
an optical encoding member in said passive zone and having a plurality of code tracks,
said first fiber optic means having a plurality of branches corresponding to said code tracks for conducting light to said code tracks,
second fiber optic means for conducting light from said passive zone to said active zone,
said second fiber optic means having a plurality of branches corresponding with said code tracks for receiving and combining the light therefrom after modulation by said code tracks,
a plurality of first color filters corresponding with said code tracks for imparting a different color to the light received by said second fiber optic means from each of said code tracks,
a plurality of photodetectors in said active zone and corresponding with said code tracks for producing electrical signals corresponding to the modulated light from said code tracks,
said second fiber optic means having a plurality of photodetector branches in said active zone for conducting portions of the combined light to said photodetectors,
and a plurality of second color filters corresponding with said photodetectors for transmitting light of only one of the different colors to each of said photodetectors whereby each photodetector receives the colored light from only the corresponding code track.

2. An optical encoder according to claim 1,
in which said first and second fiber optic means comprise distinct first and second fiber optic cables for transmitting light in the opposite directions between said active and passive zones.

3. An optical encoder according to claim 1,
in which said first and second fiber optic means include only a single fiber optic cable for transmitting light in both directions between said active and passive zones, said first and second fiber optic means including first and second beam splitters in said active and passive zones for splitting the transmitted and received light beams.

4. An optical encoder according to claim 1,
in which said first and second fiber optic means include only a single fiber optic cable for transmitting light in both directions between said active and passive zones,
said first and second fiber optic means including first and second beam splitters in said active and passive zones for splitting the transmitted and received light beams,
said first beam splitter being operative to direct the light from said source into said fiber optic cable while directing the modulated light received from said cable into said photodetector branches,
said second beam splitter being operative to direct the light received from said cable to said branches of said first fiber optic means while directing the modulated light from said code tracks into said fiber optic cable.

5. An optical encoder, comprising
a light source in a first zone,
first fiber optic means for conducting light from said source to a second zone,
an optical encoding member in said second zone and having a plurality of code tracks,
said first fiber optic means having means for distributing the light to said code tracks,
second fiber optic means for conducting light from said second zone to said first zone,
said second fiber optic means having means for receiving and combining the light from said code tracks after modulation by said code tracks,
a plurality of first color filters corresponding with said code tracks for imparting a different color to the light received by said second fiber optic means from each of said code tracks,
a plurality of photodetectors in said first zone and corresponding with said code tracks for producing electrical signals corresponding to the modulated light from said code tracks,
said second fiber optic means having means in said first zone for distributing portions of the combined light to said photodetectors,
and a plurality of second color filters corresponding with said photodetectors for transmitting light of only one of the different colors to each of said photodetectors whereby each photodetector receives the colored light from only the corresponding code track.

6. An optical encoder according to claim 5,
in which said first and second fiber optic means comprise distinct first and second fiber optic cables for transmitting light in the opposite directions between said first and second zones.

7. An optical encoder according to claim 5,
in which said first and second fiber optic means include only a single fiber optic cable for transmitting light in both directions between said first and second zones,
said first and second fiber optic means including first and second beam splitters in said first and second zones for splitting the transmitted and received light beams.

8. An optical encoder according to claim 5,
in which said first and second fiber optic means include only a single fiber optic cable for transmitting light in both directions between said first and second zones,
said first and second fiber optic means including first and second beam splitters in said first and second zones for splitting the transmitted and received light beams,
said first beam splitter being operative to direct the light from said source into said fiber optic cable while directing the modulated light received from said cable to said photodetectors,
said second beam splitter being operative to direct the light received from said cable to said code tracks while directing the modulated light from said code tracks into said fiber optic cable.

* * * * *